(12) United States Patent
Canard

(10) Patent No.: US 8,928,375 B2
(45) Date of Patent: Jan. 6, 2015

(54) PHASE-LOCKED LOOP DEVICE WITH MANAGED TRANSITION TO RANDOM NOISE OPERATION MODE

(71) Applicant: Asahi Kasei Microdevices Corporation, Tokyo (JP)

(72) Inventor: David Canard, Colombelles (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/256,015

(22) Filed: Apr. 18, 2014

(65) Prior Publication Data

US 2014/0312943 A1    Oct. 23, 2014

(30) Foreign Application Priority Data

Apr. 22, 2013    (EP) .................................. 13305526

(51) Int. Cl.
*H03L 7/06*    (2006.01)
*H03L 7/095*    (2006.01)
(52) U.S. Cl.
CPC ..................................... *H03L 7/095* (2013.01)
USPC .......................................... 327/156; 327/147
(58) Field of Classification Search
None
See application file for complete search history.

(56) References Cited

U.S. PATENT DOCUMENTS

| 7,580,497 | B2 * | 8/2009 | Wang et al. ................... 375/374 |
| 7,656,323 | B2 * | 2/2010 | Bereza et al. ................. 341/100 |
| 8,203,369 | B2 | 6/2012 | van de Beek |
| 2010/0188972 | A1 * | 7/2010 | Knapp .......................... 370/226 |
| 2011/0175682 | A1 | 7/2011 | Chen et al. |
| 2012/0038400 | A1 | 2/2012 | Talaga, Jr. |

FOREIGN PATENT DOCUMENTS

EP    1 742 359 A1    1/2007

OTHER PUBLICATIONS

Extended European Search Report dated Oct. 9, 2013 for European Application No. 13305526.9.

* cited by examiner

*Primary Examiner* — Cassandra Cox
(74) *Attorney, Agent, or Firm* — Morgan, Lewis & Bockius LLP

(57) ABSTRACT

A phase-locked loop device is configured to manage a transition from a relaxation-oscillation mode to a random noise operation mode. It is designed for progressively reducing proportional and integral coefficients that are implemented in a loop filter of the PLL device. Recovering the last values formerly used for the proportional and integral coefficients is also provided, in case the PLL lock state is lost. Such transition management may be combined with using a voltage-controlled oscillator within the PLL device, which has several control inputs.

11 Claims, 4 Drawing Sheets

PHASE-LOCKED LOOP DEVICE WITH MANAGED TRANSITION TO RANDOM NOISE OPERATION MODE

This application claims the priority and benefit of EP patent application no. EP 13305526.9, filed on Apr. 22, 2013, to Asahi Kasei Microdevices Corporation of Japan, entitled "Phase-Locked Loop Device with Managed Transition to Random Noise Operation Mode," which is hereby incorporated by reference in its entirety.

TECHNICAL FIELD

The invention relates generally to a phase-locked loop (PLL) device with a bang-bang non-linear phase detector and managed transition to random noise operation mode. It also relates generally to a process for operating a PLL device.

BACKGROUND

PLL devices are core elements for frequency synthesizers implemented in electronic circuits or radio-transmission units. There is a need for reducing the lock time and improving the operation stability of PLL devices.

A PLL device with bang-bang non-linear phase detector can generally operate in two successive operation modes from an initial start. The first operation mode may be a relaxation-oscillation mode where a phase error between a reference signal and a frequency-converted signal oscillates back and forth. This relaxation-oscillation mode splits itself into a lock acquisition phase where a lock state is not yet reached, and then a lock phase where the lock state is continually maintained so that the frequency-converted signal remains close in frequency to the reference signal. Operation stability is necessary for avoiding loss of the lock state. Otherwise, lock acquisition is started over, wasting time until the clock signal which is produced by the PLL device can be used again. For obtaining operation stability in combination with low noise in the phase of the PLL-produced clock signal, the open-loop gain of the PLL device has to be reduced. However, continuing to decrease the phase oscillation magnitude leads to capturing noise within the loop-control of the frequency of the PLL-produced clock signal. This is a random noise operation mode which occurs once the lock state is continually obtained while reducing the open-loop gain of the PLL device by a sufficient reduction extent. In this mode, the analog jitter sources generate significant dithering of the non-linearity of the phase detector, the phase detector behaving as a linear device for signals of frequency components negligible with respect to the sampling frequency (in practice, typically ten times smaller). The PLL phase error is such a signal.

There is a need for PLL devices which are capable of operating in the random noise operation mode as quickly as possible after the lock acquisition phase has started.

Additionally, each of the lock acquisition phase, lock phase, and random noise operation mode requires gain values for a proportional-integral loop filter implemented in the PLL device, which are different for obtaining minimum lock acquisition time and improved stability.

U.S. Pat. No. 8,203,369 describes a PLL device which is capable of linearizing the PLL response for a large phase error, so that the lock acquisition phase is performed more rapidly. This PLL device implements measuring of a duration between two successive sign reversals of the phase error, and combining the measured duration with the error signal itself before it is fed into the loop filter. However, such a PLL device does not detect that the lock state is actually obtained, and it cannot reach the random noise operation mode.

One object of the present invention is to provide a PLL device which is capable of reaching the random noise operation mode in a reliable and rapid manner. For example, the PLL device should perform the lock acquisition phase quickly and then maintain the lock state as long as possible including during the random noise operation.

Another object of the invention is for the PLL device to be capable of recovering the random noise operation mode automatically and as quickly as possible when the lock state has been lost.

BRIEF SUMMARY

To achieve these and other objects of the invention, in some embodiments a phase-locked loop device with managed transition to random noise operation mode includes a bang-bang non-linear phase comparator with a first comparator input intended for receiving a reference signal having a reference frequency, a second comparator input for receiving a frequency-converted signal, and a comparator output adapted for producing an error signal comprised of one out of two discrete values, possibly opposite, at each time; a loop filter of proportional-integral type, with a filter input connected to the comparator output, at least one configuration input for receiving respective values of a proportional coefficient and integral coefficient, and suitable for producing at a filter output a time-filtered error signal in accordance with the values received for the proportional and integral coefficients; a voltage-controlled oscillator (VCO) module, which has at least one control input for receiving a control signal, and a VCO output for producing a VCO signal having a VCO frequency which varies as a function of the control signal; at least one control connection arranged for connecting the filter output to the control input of the VCO module, so that the control signal is based on the time-filtered error signal; a frequency converter connected at input to the VCO output, and adapted for producing at a converter output the frequency-converted signal based on the VCO signal, the converter output being connected to the second comparator input; and a lock detector arranged for producing a lock signal indicating whether a lock condition is met during a current operation of the PLL device, and an oscillation-length value indicating a duration between two successive sign reversals for a phase time-shift that currently exists for the frequency-converted signal relative to the reference signal.

According to some embodiments, the PLL device further includes a loop controller connected at input for receiving the lock signal and the oscillation-length value, and connected at output to at least one configuration input of the loop filter. The loop controller is adapted for selecting and producing at output the values of the proportional and integral coefficients based on the following tests which are continually executed during the operation of the PLL device:

i. if the lock condition is met, then replacing the respective values of the proportional and integral coefficients as currently used within the loop filter with new values selected respectively for these proportional and integral coefficients each being smaller than the corresponding value currently used; and ii. if the lock condition is not met and the duration between two successive sign reversals for the phase time-shift is longer than a first duration threshold, then replacing the respective values of the proportional and integral coef-ficients as currently used within the loop filter with former values which were used respectively for the proportional and integral coefficients before the values currently used were selected.

Hence, during the operation of the PLL device, test i allows gradual reduction of the values for the proportional and integral coefficients of the loop filter, while ensuring that the lock state is maintained. Test ii ensures that the lock state is automatically tracked again and recovered if lost at any time during the PLL operation. Progressive reduction of the proportional and integral coefficients is thus provided so that rapid lock acquisition is first performed. Then, progression until the random noise operation mode is achieved, with values for the proportional and integral coefficients appropriate for each stage of this progression. The risk for losing the lock state can thereby be reduced.

In some embodiments, the phase comparator and the loop filter may be adapted so that the error signal and the time-filtered error signal are digital signals.

For example, the phase comparator may be adapted so that the error signal equals a first error signal value as long as the phase time-shift of the frequency-converted signal relative to the reference signal is positive, and a second error signal value which is different from the first one as long as the phase time-shift is negative. Such embodiments are simple and easy to produce, and the lock detector may be connected at an input to the comparator output.

In some embodiments, the lock detector may be adapted so that the lock condition includes a count number higher than a threshold number for successive durations which are each less than a second duration threshold, these durations existing between two successive sign reversals of the phase time-shift of the frequency-converted signal relative to the reference signal. Such embodiments of the lock detector are simple and easy to produce.

Advantageously, the loop controller may be further adapted in some embodiments so that the first duration threshold which is used in test ii is smaller when test ii is executed while current values are used respectively for the proportional and integral coefficients, when compared to test ii being executed while other values which are respectively larger than the current values are used for the proportional and integral coefficients. Rapid reaction to lock state loss can thus be achieved during the random noise operation of the PLL device.

In some embodiments, the PLL device relates to a VCO module which is provided with several control inputs, for example, inputs for selecting a VCO frequency range among a multi-scale range structure. To this end, the PLL device may include at least two control connections arranged in parallel between the filter output and respective control inputs of the VCO module. All the control connections are associated with respective VCO gain values which are different from one another. The loop controller may then be adapted for selecting only one of these control connections at any time for transmitting, to the corresponding control input of the VCO module, a control signal which is based on the time-filtered error signal, while each control input of the VCO module which corresponds to a non-selected control connection is fed with a respective constant control signal. The loop controller is further adapted for successively selecting the control connections in the order of decreasing VCO gain values, and switching from one control connection currently selected to a next one once the lock condition is met for the currently selected control connection. Furthermore, the PLL device also includes a Digital Controlled Oscillator (DCO) center code finder adapted for determining a mean value corresponding to the time-filtered error signal when the lock condition is met for one of the control connections other than that associated with the smallest VCO gain value, and then constantly feeding the corresponding VCO input with this mean value as the constant control signal while the control connections with smaller VCO gain values are selected thereafter. Finally, the values of the proportional and integral coefficients are selected based on the tests i and ii when the control connection associated with the smallest VCO gain value is selected last.

In some embodiments, the loop controller may be adapted for forcing a mid-range control signal at each control input of the VCO module which corresponds to one control connection associated with a VCO gain value smaller than that of the control connection currently selected.

According to a simple and easy to produce embodiment of the DCO center code finder, such a finder may include a two-stage shift register and an averaging unit. The shift register is connected for being fed with the time-filtered error signal upon each sign reversal of the phase time-shift of the frequency-converted signal relative to the reference signal. The averaging unit is connected for transmitting to the loop controller, the mean value being based on the values contained respectively in both stages of the shift register.

Some embodiments include a process for operating a PLL device having at least a phase comparator, a loop filter of proportional-integral type, a VCO module, and a frequency converter connected so as to provide PLL operation. The loop filter is suitable for time-filtering an error signal in accordance with respective values of a proportional coefficient and integral coefficient. According to these embodiments, the PLL device is operated using values for the proportional and integral coefficients which are selected by executing the tests i and ii continually during the operation of the PLL device. The phase time-shift concerned in test ii is that existing for a frequency-converted signal produced by the frequency converter, with respect to a reference signal received by the phase comparator. Such an operating process may be implemented using a PLL device according to some of the present embodiments.

When the VCO module is provided with several control inputs, at least two control connections may be arranged in parallel between the filter output and respective control inputs of the VCO module. All control connections may be associated with respective VCO gain values which are different from one another. The process may further include, during a continuing operation of the PLL device:

selecting only one of the control connections at any time for transmitting, to the corresponding control input of the VCO module, a control signal based on a time-filtered error signal produced by the loop filter, while each control input of the VCO module which corresponds to a non-selected control connection is fed with a respective constant control signal;

successively selecting the control connections in the order of decreasing VCO gain values, and switching from one control connection currently selected to a next one once the lock condition is met for the currently selected control connection; and when the lock condition is met for one of the control connections other than that associated with the smallest VCO gain value, determining a mean value corresponding to the time-filtered error signal and then constantly feeding the corresponding VCO input with this mean value as the constant control signal while the control connections with smaller VCO gain values are selected thereafter.

The values of the proportional and integral coefficients are selected based on the tests i and ii when the control connection associated with the smallest VCO gain value is selected last.

In some embodiments, the respective constant control signal, fed into each control input of the VCO module which corresponds to a non-selected control connection associated with a VCO gain value smaller than that of the control connection currently selected, is a mid-range control signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

Similar reference numbers which are indicated in different figures denote similar elements of elements with similar functions. In addition, components with well-known functions and operation may not be described in detail.

DETAILED DESCRIPTION

Figure 1:
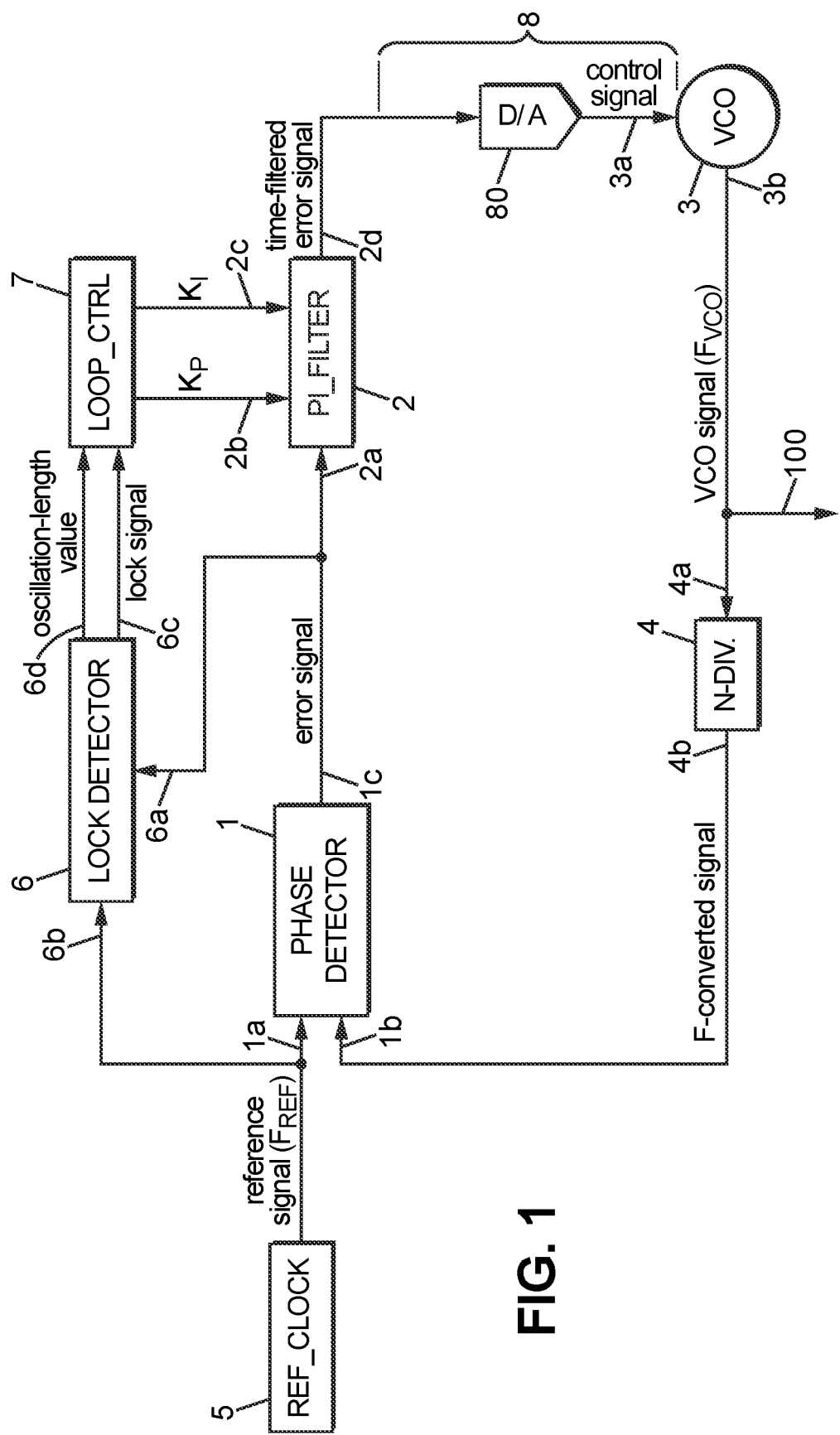
FIG. 1 is a block diagram of a PLL device according to some embodiments.

With reference to FIG. 1, which is a block diagram of a PLL device according to some embodiments, the reference numbers indicated therein have the following meanings:

1 a phase comparator, denoted PHASE DETECTOR, with inputs respectively labelled 1a and 1b, and output 1c
2 a loop filter, denoted PI_FILTER, with signal input 2a, configuration inputs 2b and 2c, and signal output 2d
3 a voltage-controlled oscillator (VCO) module, with control input 3a dedicated for entering a control signal, and output 3b for producing a VCO signal
4 a frequency converter, denoted N-DIV., with input 4a and output 4b
5 a reference clock, denoted REF_CLOCK, for supplying a reference signal which has a reference frequency $F_{REF}$
6 a lock detector, with detector inputs respectively labelled 6a and 6b, and outputs 6c and 6d
7 a loop controller, denoted LOOP_CTRL
8 a control connection, extending from the filter output 2d to the control input 3a of the VCO module 3
100 an output of the PLL device, for delivering the PLL-produced signal The reference clock 5 may be of any type, provided that its reference frequency $F_{REF}$ is accurately known. It is connected so as to feed the input 1a of the phase comparator 1 with the reference signal.

The phase comparator 1 produces at output 1c an error signal which is representative of the sign of the phase difference between the reference signal received at the input 1a and another periodic signal which is fed into the other comparator input 1b. This phase difference is the time-shift between the respective phases of both signals input into the phase comparator 1.

In some embodiments, the loop filter 2 is of a proportional-integral type. It produces, at output 2d, a time-filtered error signal which is based on the error signal fed into input 2a. The error signal may be analog but in some embodiments is preferably digital, depending on the type of the phase comparator 1 and loop filter 2 actually used. Any filter can be analyzed using its pulse response. A proportional-integral filter may be defined as a filter with a Laplace-transform of its pulse response which has one pole and one zero value. The operation of such a loop filter implements two coefficients, namely the proportional coefficient $K_P$ and the integral coefficient $K_I$, with respective values which are fed into the configuration inputs 2b and 2c of the loop filter 2.

In some embodiments, the VCO module 3 produces at output 3b a VCO signal which has a frequency determined by the control signal entered at input 3a. This frequency, denoted $F_{VCO}$, varies as a function of the control signal.

In some embodiments, the control signal is obtained from the time-filtered error signal within the control connection 8. Depending on the input 3a of the VCO module 3, the control connection 8 may include a digital-to-analog converter 80, and possibly other components such as a low-pass filter (not shown).

The frequency converter 4 may be a frequency divider arranged for producing at output 4b an F-converted signal which is based on the VCO signal received at input 4a. N denotes a non-zero division factor which is implemented within the frequency converter 4, so that the F-converted signal results from the VCO signal by N-dividing the frequency $F_{VCO}$ of the VCO signal. The F-converted signal thus obtained is fed into the input 1b of the phase comparator 1.

In some embodiments, the phase comparator 1, the loop filter 2, the VCO module 3, and the frequency converter 4 form a PLL loop, with a frequency-elevated signal delivered at output 100. In the PLL loop operation, the control signal used for tuning the VCO frequency $F_{VCO}$ is derived from the error signal by time-filtering performed by the loop filter. Thus, the time-filtered error signal and the control signal are each representative of the VCO frequency $F_{VCO}$ which is currently synthesized by the VCO module 3.

Figure 2A:
FIGS. 2a and 2b are diagrams relating to an operation of, for example, the PLL device of FIG. 1, showing time-variations respectively for an error signal and a frequency of a PLL-produced signal.
Figure 2B:
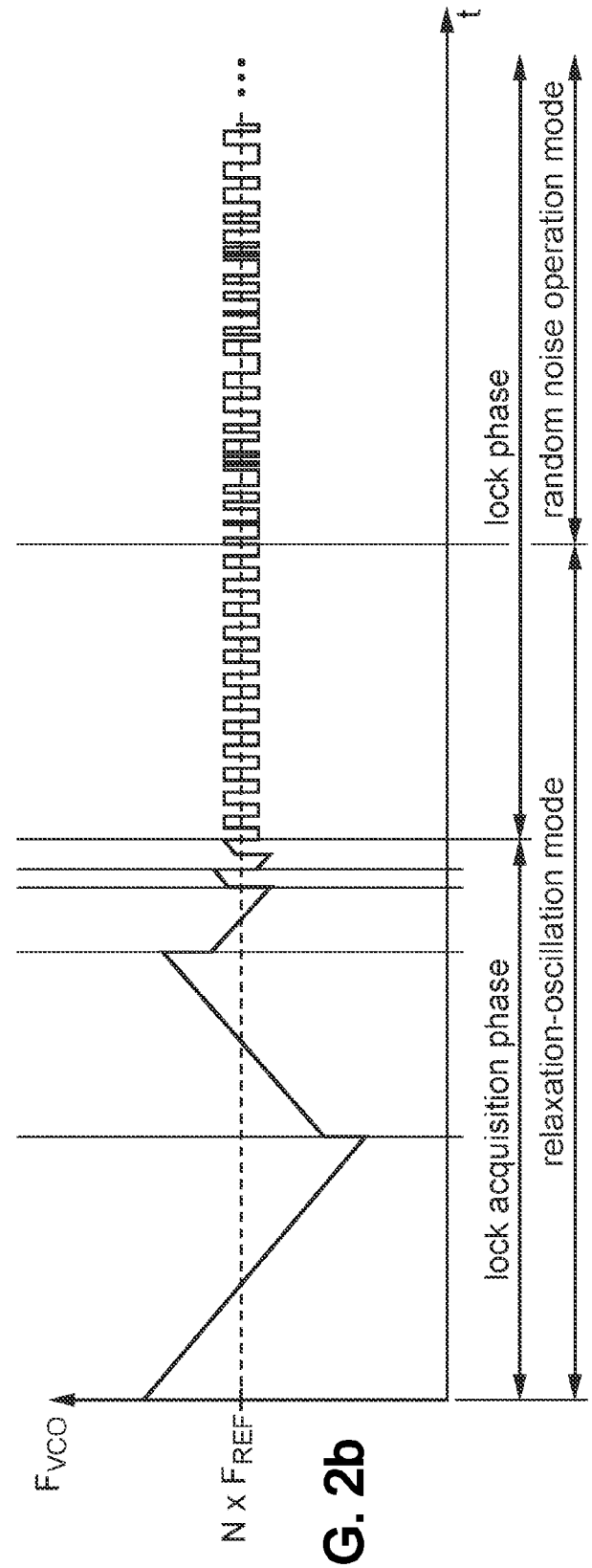

The diagrams of FIGS. 2a and 2b illustrate an idealized progress according to some embodiments in the operation of, for example, the PLL device of FIG. 1, such progress generally being a target operation. The PLL lock state corresponds to a continuing operation of the PLL device, where the difference between the respective frequencies of the F-converted signal and the reference signal varies according to a steady or almost steady sequence. This corresponds to the indicated lock phase. Before the lock state is obtained, the PLL loop operates for reducing the frequency difference between the F-converted signal and the reference signal, with possible oscillations of the frequency difference before the relaxation leads to the lock state. This initial operation is commonly called a lock acquisition phase, and forms the relaxation-oscillation operation with a first part of the lock phase.

The diagrams of FIGS. 2a and 2b correspond to each other along a vertical alignment. The common X-axis is time, denoted t. The Y-axis in FIG. 2a is the error signal as output by the phase comparator 1. Here, a two-state phase comparator is used as an example, with an output value equal to −0.5 volt when the phase of the F-converted signal has time-lead over the reference signal, and equal to +0.5 volt when the phase of the F-converted signal has delay relative to the reference signal. In the first situation, the $F_{VCO}$-frequency is decreased due to the control signal fed into the input 3a of the VCO module 3, and it is increased in the second situation. FIG. 2b shows two oscillations of the $F_{VCO}$-frequency before the lock state is obtained with $F_{VCO}$ substantially equal to $N \times F_{REF}$.

Also, the duration of the lock acquisition phase, the stability of the lock state, and the residual oscillation of the $F_{VCO}$-frequency depend on the values of the proportional and integral coefficients $K_P$ and $K_I$ which are actually implemented. The $K_P$- and $K_I$-values should be higher at the beginning of the relaxation-oscillation mode for allowing rapid decrease of the difference between $F_{VCO}/N$ and $F_{REF}$. Thereafter, the coefficients $K_P$ and $K_I$ should be decreased for avoiding continuing oscillations and allowing rapid relaxation.

In some embodiments, one issue is maintaining the lock state with $F_{VCO}/N$ as close as possible to $F_{REF}$, even when the phase difference between the F-converted signal and the reference signal is of the same order as the amplitude of random noise. This corresponds to the random noise operation mode, where the $F_{VCO}$-frequency of the PLL-produced signal oscillates about N times the reference frequency $F_{REF}$ with random oscillation duration (see right parts of FIGS. 2a and 2b). Avoiding increase of the PLL-noise requires handling small values for the control signal. To this end, the $K_P$- and $K_I$-values are to be decreased again, but the lock state may then sometimes be lost. An embodiment shown in the flowchart of FIG. 3 combines these issues for providing rapid progress of the PLL operation and then operating in the random noise operation mode.

Figure 3:
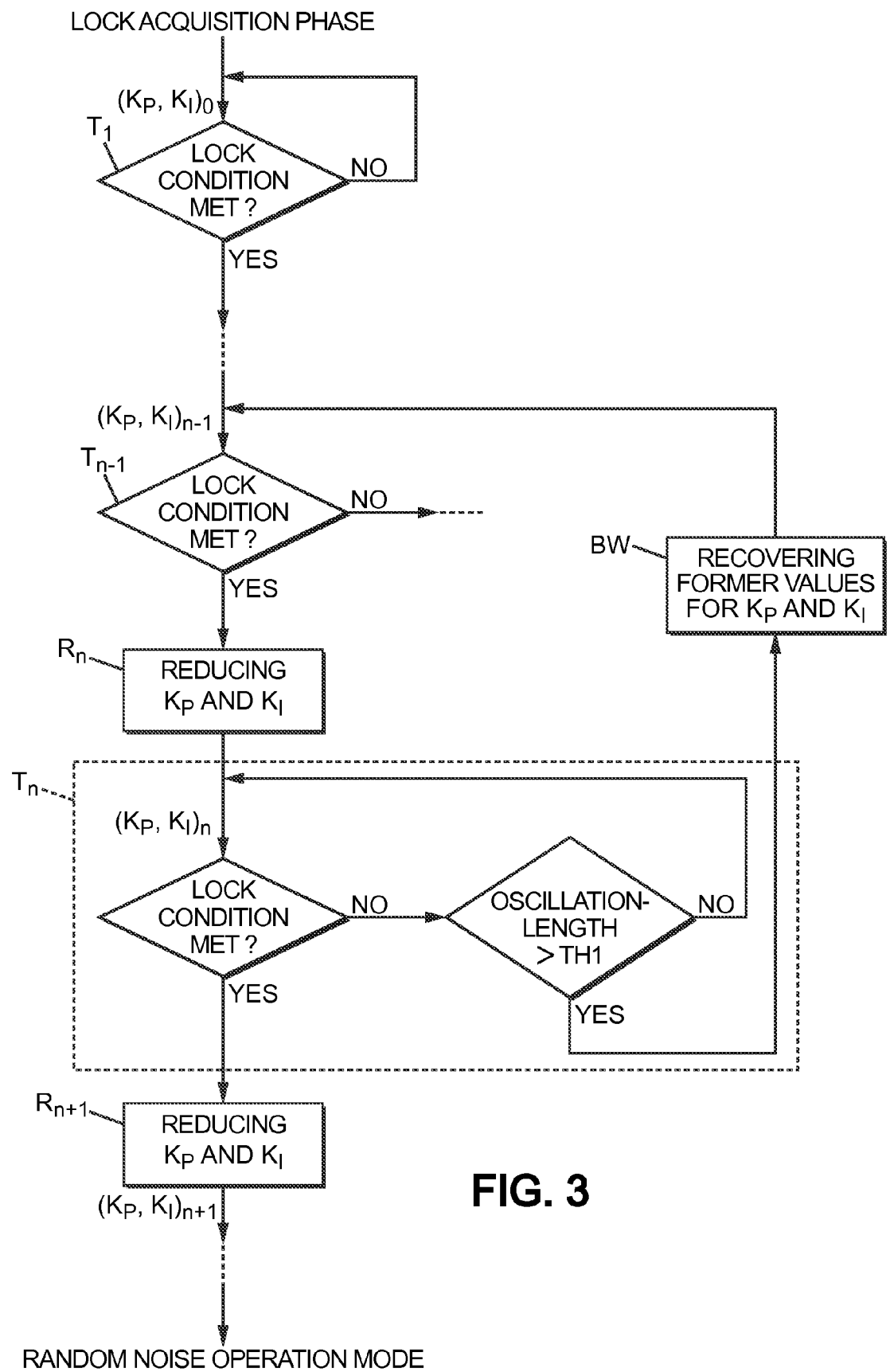
FIG. 3 is a block diagram showing operation steps implemented in the PLL device of FIG. 1.

In FIG. 3, label $T_1$ denotes a lock condition test which corresponds to the transition between the lock acquisition phase and the lock phase. The value pair denoted $(K_P, K_I)_0$ for the proportional and integral coefficients $K_P$ and $K_I$ corresponds to the values used initially in the lock acquisition phase. Once the lock condition is met, the $K_P$- and $K_I$-values are reduced step by step unless the lock state is lost accidentally. Then, the former values used for $K_P$ and $K_I$ before the last reduction are taken again in a backward step labeled BW (for "Band Width"), and the reduction process is continued again from this restored configuration.

Steps $T_n$ and $R_{n+1}$ form the recurrent sequence of the coefficient reduction process implemented in some embodiments. As an example, suppose that the value pair denoted $(K_P, K_I)_n$ is currently implemented within the loop filter 2, n being a integer greater than or equal to unity. If the lock condition is detected positively in the test step $T_n$, then the reduction step $R_{n+1}$ leads to the value pair $(K_P, K_I)_{n+1}$ being implemented from now. If the lock condition appears not to be met in the test step $T_n$, then the oscillation-length of the error signal is tested. The oscillation-length value being greater than a duration threshold denoted TH1 confirms that the lock state is actually lost. In this situation, the process is continued with step BW for recovering the $K_P$- and $K_I$-values that were used before the current values, namely, recovering the value pair $(K_P, K_I)_{n-1}$ used before the test step $T_{n-1}$ has been formerly positively-checked and has lead to the reduction step $R_n$ which produced the current $K_P$- and $K_I$-values. The oscillation-length value being less than or equal to the duration threshold TH1 means that further continued operation of the PLL device with the value pair $(K_P, K_I)_n$ is still necessary for indicating that the PLL still operates in the lock state or that the lock state is lost. Such a process for reducing the $K_P$- and $K_I$-values may be continued until entering the random noise operation mode, and the PLL operation further continued in this mode. The table below indicates possible value pairs $(K_P, K_I)_n$ for implementing some embodiments, together with values for the first duration threshold TH1:

| n | $K_P$ | $K_I$ | TH1 |
|---|-------|-------|-----|
| 0 | 400 | 4 | — |
| 1 | 40 | 1 | 100 |
| 2 | 10 | 0.25 | 100 |
| 3 | 4 | 0.125 | 30 |
| 4 | 0.5 | 0.015625 | 30 |

The integer n is not limited in maximum value, in particular for producing a smooth reduction in the $K_P$- and $K_I$-values, so as to decrease the probability of losing the lock state upon or after a reduction step. The duration threshold TH1 may be constant or decreasing for two successive n-values.

The lock condition is continually checked by the lock detector 6 (see, e.g., FIG. 1), and the lock detector 6 produces the lock signal for indicating that the current PLL state is locked or unlocked. The oscillation-length value may also be provided by the lock detector 6. The whole process may be controlled by the loop controller 7, which is supplied with the lock signal and the oscillation-length value by the lock detector 6. For this purpose, the input 6a of the lock detector 6 is fed with the error signal as produced by the phase comparator 1, and the input 6b is fed with the reference signal as a base clock for measuring the time-length of each constant-sign segment existing within the error signal.

Figure 4:
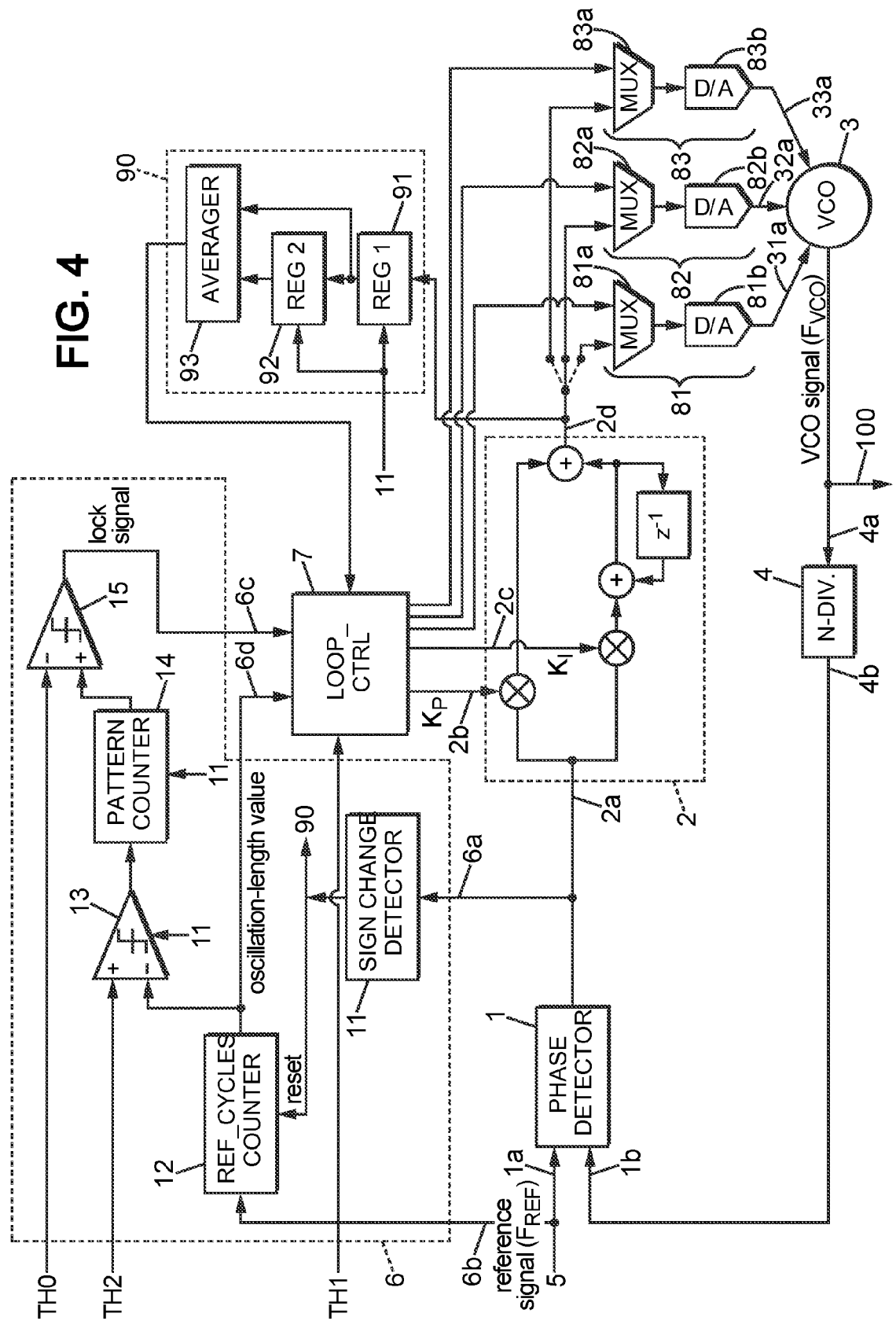
FIG. 4 is a block diagram of a PLL device according to some embodiments.

FIG. 4 illustrates an example PLL according to some embodiments. The interior of box 6 in FIG. 4 shows a possible functional scheme for the lock detector. Detector 11, denoted SIGN CHANGE DETECTOR, identifies the sign changes in the error signal as received at the detector input 6a. Counter 12, which is denoted REF_CYCLES COUNTER, counts the successive clock cycles in the reference signal as received at the detector input 6b from the reference clock 5. The counter 12 is reset to zero each time the detector 11 identifies a sign change, so that counter 12 produces, at output, a value for the duration of the constant-sign segment which is currently occurring in the error signal. This duration is the oscillation-length value once the next sign change has occurred, and is transmitted to the loop controller 7 via the detector output 6d.

The comparator 13 outputs a positive signal when the oscillation-length value is less than a second duration threshold TH2. Then, the pattern counter 14 outputs the number of such oscillation-lengths shorter than TH2, which are successively detected. It is reset to zero once one oscillation-length is measured by the counter 12 which overruns the duration threshold TH2. Updating of the comparator 13 and pattern counter 14 is triggered upon each sign change indicated by the detector 11. The number of oscillation-lengths which have been measured as being less than TH2, as outputted by the pattern counter 14, is compared to a threshold number TH0 by the comparator 15. If the number exceeds the threshold TH0, comparator 15 outputs the lock signal with a value corresponding to the lock state for the current PLL operation. Otherwise, the lock signal is outputted with a value indicating an unlock state for the PLL operation. For example, the threshold number TH0 may equal 4, and the second duration threshold TH2 may equal 30.

In some embodiments, the loop controller 7 is adapted for implementing an algorithm corresponding to the process of FIG. 3.

The interior of box 2 in FIG. 4 is a representation of a typical proportional-integral filter in some embodiments, showing the roles of both the proportional coefficient $K_P$ and integral coefficient $K_I$. The label $z^{-1}$ indicates recovery of the former value which was handled, thus producing the time-integration function by addition with the current value.

Reference numbers 81-83 denote several control connections, three in some example embodiments, which connect the filter output 2d to each of respective separate control inputs 31a-33a of the VCO module 3. As an example, each control connection 81-83 may include a respective digital-to-analog converter 81b-83b. Each control connection 81-83 is associated with a respective VCO gain value, which are typically each different. For example, the VCO gain is higher for the control connection 81, intermediate for the control connection 82, and small for the control connection 83. Multiplexers 81a-83a may be arranged at the respective entrances of the control connections 81-83 for inputting into each control connection either the time-filtered error signal or a constant signal produced by the loop controller 7. The multiplexers 81a-83a are themselves controlled by the loop filter 7 depending on a current PLL operation step, and so that only one of them is connected at any one time to the filter output 2d.

In some embodiments, the DCO center code finder 90 denotes a module suitable for calculating the mean value of the time-filtered error signal over the last oscillation jump. It may also be clocked by the sign changes of the error signal. According to an example embodiment having a simple design for the module 90, this module 90 may comprise a shift register with two stages 91 and 92, denoted REG 1 and REG 2 respectively. The successive values of the time-filtered error signal are thus pushed first into the stage 91, and then into the stage 92. An averaging unit 93 is fed at its input with the contents of both stages 91 and 92, so as to output a mean value of the two last values of the time-filtered error signal. This mean value is transmitted to the loop controller 7 for the loop controller 7 to forward to the multiplexers 81a-83a appropriately as explained below.

In some embodiments, when the PLL device is provided with several control connections to the VCO module 3, setting of the range for the frequency $F_{VCO}$ is started with the control connection which has the highest VCO gain value—for example, the control connection 81 in the present example. During this first PLL operation step, the loop controller 7 sets the control signals transmitted respectively by the control connections 82 and 83 to fixed initial values—for example, respective mid-range values. Towards this purpose, the multiplexers 82a and 83a are controlled by the loop controller 7 so as to connect the control inputs 32a and 33a to corresponding outputs of the loop controller 7. The multiplexer 81a simultaneously connects the filter output 2d to the control input 31a of the VCO module 3. It also sets the proportional and integral coefficients of the loop filter 2 to values appropriate with respect to the high VCO gain value. For example, the $K_P$-value may be set to 50, and the $K_I$-value may be set to 0.5. Then, the PLL operation leads to the lock state and convergence to a mean value as calculated by the module 90 for the time-filtered error signal transmitted by the control connection 81. This mean value corresponds to the average $F_{VCO}$-frequency synthesized once the lock state has been reached. It is then set by the loop controller 7 at the VCO control input 31a which corresponds to the control connection 81.

This frequency range setting is reproduced for the control connection 82. The control signal transmitted by the control connection 81 is maintained according to the mean value previously determined by the loop controller 7. The control signal transmitted by the control connection 83 is again maintained at its fixed initial value. The PLL operation now leads to another mean value for the time-filtered error signal transmitted by the control connection 82. This other mean value is set, in turn, by the loop controller 7 at the VCO control input 32a which corresponds to the control connection 82.

Once both control signals transmitted by the control connections 81 and 82 have been set, the loop controller 7 connects the filter output 2d to the entrance of the control connection 83. The PLL operation continues with the control connection associated with the smallest VCO gain value being active. This operation step is shown, for example, in FIG. 3.

The multiple control connections provided to the VCO module, as described above with respect to some embodiments, may be extended to any number of control connections.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

The invention claimed is:

1. A phase-locked loop (PLL) device with managed transition to random noise operation mode, comprising:
 a bang-bang non-linear phase comparator comprising
  a first comparator input configured to receive a reference signal having a reference frequency,
  a second comparator input configured to receive a frequency-converted signal, and
  a comparator output configured to produce an error signal having one of two discrete values;
 a loop filter of proportional-integral type, comprising
  a filter input connected to the comparator output,
  at least one configuration input configured to receive respective values of a proportional coefficient and an integral coefficient,
  the loop filter configured to produce at a filter output a time-filtered error signal in accordance with the values received for the proportional and integral coefficients;
 a voltage-controlled oscillator (VCO) module, comprising
  at least one control input configured to receive a control signal, and
  a VCO output to produce a VCO signal having a VCO frequency varying as a function of the control signal;
 at least one control connection configured to connect the filter output to the control input of the VCO module, whereby the control signal is based on the time-filtered error signal;
 a frequency converter, connected at an input to the VCO output, and configured to produce at a converter output the frequency-converted signal based on the VCO signal, the converter output being connected to the second comparator input; and
 a lock detector configured to produce
  a lock signal indicating whether a lock condition is met during a current operation of the PLL device, and
  an oscillation-length value indicating a duration between two successive sign reversals for a phase time-shift currently existing for the frequency-converted signal relative to the reference signal;
 wherein the PLL device further comprises a loop controller connected at an input to receive the lock signal and the oscillation-length value, and connected at an output to the at least one configuration input of the loop filter, and configured to select and produce at the output the values of the proportional and integral coefficients based on the following tests which are continually executed during the operation of the PLL device:

test i: if the lock condition is met, then replacing the respective values of the proportional and integral coefficients as currently used within the loop filter with new values selected respectively for the proportional and integral coefficients, each of the new values being smaller than the corresponding values currently used; and test ii: if the lock condition is not met and the duration between two successive sign reversals for the phase time-shift is longer than a first duration threshold, then replacing the respective values of the proportional and integral coefficients as currently used within the loop filter (2) with former values which were used respectively for the proportional and integral coefficients before the values currently used had been selected.

2. The PLL device of claim 1, wherein the phase comparator and the loop filter are configured so that the error signal and the time-filtered error signal are digital signals.

3. The PLL device of claim 2, wherein the phase comparator is configured so that the error signal equals a first error signal value while the phase time-shift of the frequency-converted signal relative to the reference signal is positive, and a second error signal value different from the first error signal value while the phase time-shift is negative, and wherein the lock detector is connected at an input to the comparator output.

4. The PLL device of claim 1, wherein the lock detector is configured so that the lock condition includes a count number being higher than a threshold number (TH0), for successive durations which are each less than a second duration threshold (TH2), the durations existing between two successive sign reversals of the phase time-shift of the frequency-converted signal relative to the reference signal.

5. The PLL device of claim 1, wherein the loop controller is further configured so that the first duration threshold used in test ii is smaller when the test ii is executed while current values are used respectively for the proportional and integral coefficients, when compared to test ii being executed while other values respectively larger than the current values were used for the proportional and integral coefficients.

6. The PLL device of claim 1, further comprising at least two control connections arranged in parallel between the filter output and respective control inputs of the VCO module, the control connections being associated with respective VCO gain values different from one another, the loop controller configured to select only one of the control connections at a time for transmitting, to the corresponding control input of the VCO module, a control signal based on the time-filtered error signal, while each control input of the VCO module which corresponds to a non-selected control connection receives a respective constant control signal, the loop controller further configured to successively select the control connections in order of decreasing VCO gain values, and to switch from one control connection currently selected to a next control connection once the lock condition is met for the currently selected control connection, the PLL device further comprising a DCO center code finder configured to determine a mean value corresponding to the time-filtered error signal once the lock condition becomes met for one of the control connections other than the control connection associated with the smallest VCO gain value, and then constantly feeding the corresponding VCO input with the mean value as the constant control signal while the control connections with smaller VCO gain values are selected thereafter, the values of the proportional and integral coefficients being selected based on the tests i and ii when the control connection associated with the smallest VCO gain value is selected last.

7. The PLL device of claim 6, wherein the loop controller is further configured to force a mid-range control signal at each control input of the VCO module corresponding to one control connection associated with a VCO gain value smaller than that of the control connection currently selected.

8. The PLL device of claim 6, wherein the DCO center code finder comprises a two-stage shift register and an averaging unit, the shift register being connected to receive the time-filtered error signal upon each sign reversal of the phase time-shift of the frequency-converted signal relative to the reference signal, and the averaging unit being connected to transmit, to the loop controller, the mean value based on values contained respectively in both stages of the shift register.

9. A process for operating a PLL device comprising a phase comparator, a loop filter of proportional-integral type, a voltage-controlled oscillator (VCO) module, and a frequency converter connected so as to provide PLL operation, the loop filter configured to time-filter an error signal in accordance with respective values of a proportional coefficient and integral coefficient, the process comprising:

operating the PLL device using values for the proportional and integral coefficients selected by executing the following tests continually during the operation of the PLL device:

test i: if a lock condition is met, then replacing respective values of the proportional and integral coefficients as currently used within the loop filter with new values selected respectively for the proportional and integral coefficients, each of the new values being smaller than the corresponding values currently used; and test ii: if the lock condition is not met and a duration between two successive sign reversals for a phase time-shift is longer than a first duration threshold, then replacing the respective values of the proportional and integral coefficients as currently used within the loop filter with former values which were used respectively for the proportional and integral coefficients before the values currently used had been selected, the phase time-shift existing for a frequency-converted signal produced by the frequency converter, with respect to a reference signal received by the phase comparator.

10. The process of claim 9, wherein at least two control connections are arranged in parallel between a filter output of the loop filter and respective control inputs of the VCO module, the control connections being associated with respective VCO gain values different from one another, the process further comprising:

during a continuing operation of the PLL device:

selecting only one of the control connections at any time for transmitting to the corresponding control input of the VCO module a control signal based on a time-filtered error signal produced by the loop filter, while each control input of the VCO module which corresponds to a non-selected control connection receives a respective constant control signal;

thereby successively selecting the control connections in order of decreasing VCO gain values, and switching from one control connection currently selected to next one once the lock condition is met for the currently selected control connection;

when the lock condition becomes met for one of the control connections other than that associated with the smallest VCO gain value, determining a mean value corresponding to the time-filtered error signal and then constantly feeding the corresponding VCO input with the mean value as the constant control signal while the control connections with smaller VCO gain values are selected thereafter, wherein the values of the proportional and integral coefficients are selected based on the tests i and ii when the control connection associated with the smallest VCO gain value is selected last.

11. The process of claim 10, wherein the respective constant control signal, which is received by each control input of the VCO module which corresponds to a non-selected control connection associated with a VCO gain value smaller than that of the control connection currently selected, is a mid-range control signal.

* * * * *